United States Patent
Galm

[19]

[11] Patent Number: 5,814,904
[45] Date of Patent: Sep. 29, 1998

[54] STATIC SWITCH METHOD AND APPARATUS

[75] Inventor: James M. Galm, Shaker Heights, Ohio

[73] Assignee: Cyberex, Inc., Mentor, Ohio

[21] Appl. No.: 759,572

[22] Filed: Dec. 5, 1996

Related U.S. Application Data

[63] Continuation-in-part of Ser. No. 412,067, Mar. 28, 1995, Pat. No. 5,644,175.

[51] Int. Cl.$^6$ ..................................................... H01H 35/00
[52] U.S. Cl. ............................ 307/130; 307/131; 307/64; 307/85
[58] Field of Search ................................. 307/43, 64, 65, 307/66, 80, 85, 86, 87, 112, 193, 116, 12 S, 130, 131

[56] References Cited

U.S. PATENT DOCUMENTS

| | | | |
|---|---|---|---|
| 4,622,513 | 11/1986 | Stich | 323/343 |
| 4,717,841 | 1/1988 | Dumortier et al. | 327/461 |
| 4,742,424 | 5/1988 | Kautzer et al. | 361/78 |
| 4,761,563 | 8/1988 | Ross | 307/87 |
| 5,079,688 | 1/1992 | Kido | 363/125 |
| 5,138,184 | 8/1992 | Keefe | 307/64 |
| 5,229,651 | 7/1993 | Baxter, Jr. et al. | 307/66 |
| 5,319,514 | 6/1994 | Walsh et al. | 361/59 |
| 5,386,147 | 1/1995 | Bonneau et al. | 307/64 |

*Primary Examiner*—William M. Shoop, Jr.
*Assistant Examiner*—Jonathan S. Kaplan
*Attorney, Agent, or Firm*—Watts, Hoffmann, Fisher & Heinke Co., L.P.A.

[57] ABSTRACT

Method and apparatus for providing alternate current paths to a junction through different sets of gate controlled SCRs coupled to the junction. The method starts with the step of initiating a switch from an active set of SCRs to an inactive set by removing a gate signal from two parallel connected, opposite sense current carrying SCRs which in combination carry AC current in either direction. Removal of the gating signal is often initiated, for example, in response to an indication that one alternating current source is faulty so that a switch to a second source is initiated. Current is then sensed through the two SCRs of the active set to determine a current carrying state for each of those two SCRs. After the state of the current carrying SCRs is determined the current carrying state of the SCRs is confirmed during a delay time period. If the current carrying state of either of said two SCRs is the same during the delay time period, a gating signal is applied to a corresponding SCR in an inactive set to enable current flow through that corresponding SCR. Once both SCRs in the inactive set have been activated the switch is complete. By waiting until the current has been confirmed during the delay period inappropriate activation of the gate signals of an inactive switch is prevented.

10 Claims, 8 Drawing Sheets

STATIC SWITCH METHOD AND APPARATUS

CROSS REFERENCE TO RELATED APPLICATION

The present application is a continuation-in-part patent application that includes subject matter common with application Ser. No. 08/412,067, now U.S. Pat. No. 5,644,175, entitled "New and Improved Static Switch Method and Apparatus" to Gaim having a filing date in the United States Patent and Trademark Office of Mar. 28, 1995.

FIELD OF THE INVENTION

The present invention relates to a static switch for providing multiple current paths between a power source and a load that is energized by that source. More specifically the invention relates to a static switch and switch controller for efficient switching between active current carrying devices in a way less likely to cause damage to circuits connected to the static switch.

BACKGROUND ART

It is often important and sometimes critical that a back up power source be available in case a primary power source is either unavailable or degrades until it is not suitable for powering a load. A hospital or a large computer center may, for example, have access to two separate sources of alternating current power for operating some or all of the equipment.

A prior art switched power source is disclosed in U.S. Pat. No. 5,138,184 to Keefe. This patent discloses a solid state, static power supply control system for transferring a load from a preferred source of AC power to an alternate source of AC power.

Cyberex Inc., assignee of the present invention, is one of a number of suppliers of solid state switches. These switches utilize pairs of gate activated silicon controlled rectifiers or SCRs that are connected in parallel. Each pair of SCRs conducts current from a single pole of alternating current to a load. One SCR conducts current in one direction and a second, oppositely connected SCR conducts current in a second direction as the AC source switches polarity. When both SCRs are gated into conduction, first one and then the other SCR provides a low resistance path for alternating current power as current flow alternates back and forth during the AC power cycle.

A transfer from a faulty power source to an alternate power source requires the active or conductive SCRs be de-activated and a second set of SCRs pairs be activated to couple an alternate power source to the load. Such a transfer should be accomplished with a minimum disruption of current flow to the load and also should be accomplished with no current transfer between the two power sources.

Present gate control algorithms generally use a technique that suffers certain deficiencies. Upon initiation of a transfer command, a first set of SCRs that are carrying current are ungated. When current stops flowing through this first set of SCRs, a second set of SCRs through which current is to begin passing are gated on. For multiple pole switches, either individual poles are treated separately, or entire banks of poles associated with the ports are first ungated and then a new bank gated on.

Prior art methods guarantee current disruption during the switching process. Current disruption for one half of a 60 hertz power signal is not important for most applications but can be critical in data monitoring and processing operations. Present switching methods result in particularly severe disruption of current when three phase power sources are not exactly aligned in phase, or do not share a common neutral connection.

In the copending application to Galm there is described an algorithm for controlling the switching from an active set of SCRs that are conducting to a second inactive set of SCRs that are rendered conductive in a specified manner. One feature of the invention disclosed in the Galm application is the confirmation of the sense of current flow through a pair of parallel connected SCRs subsequent to an initial determination of the current flow through those SCRs.

While a preferred use of the invention disclosed in the Galm application works well under almost all conditions, certain loads have caused switching that makes the algorithm less efficient that it should be. The present invention addresses those instances of inappropriate switching by use of a somewhat different criteria for determining the state of a conducting set of SCRs.

Earlier filed U.S. patent application 08/412,067 discloses a method and apparatus for providing alternate current paths to a junction through different sets of gate controlled current carrying devices coupled to the junction. The preferred method disclosed in this application starts with the step of initiating a switch from an active device set to an inactive device set by removing a gate signal from two parallel path, opposite sense current carrying devices which in combination form the active device set. Such a step might be initiated for example in response to an indication that one alternating current source was faulty so that a switch would be instituted to connect a load to a secondary source. Experience with the system disclosed in this application indicates that for certain loads (typically inductive loads) the switching process is not conducted as efficiently as for other loads and the present invention addresses such situations.

DISCLOSURE OF THE INVENTION

Apparatus constructed in accordance with one embodiment of the present invention couples either a source or a load to a junction by controlled activation of first and second sets of gate controlled switches that are coupled to the junction. A monitoring circuit monitors a current status of the switches of the first and second sets of gate controlled switches by categorizing a current status of the devices that make up a device set as having either a positive current carrying state; a negative current carrying state; or no current state, i.e. in a blocking state.

The apparatus provides alternate current paths to a junction through gate controlled current carrying devices such as silicon controlled rectifiers. A switch is initiated away from a first current path through a first, active device set of two or more current carrying devices to a second current path through a second, inactive device set of two or more current carrying devices by removing a current sustaining gate signal from the current carrying devices of the first device set.

A current status of the devices of the first, active device set is determined by monitoring a voltage across the first device set. If the voltage falls within a specified range at least one of the devices that make up the active device set is designated as being current carrying and otherwise designated as blocking current in both directions. The voltage across the devices of the first device set is again sensed to confirm the current carrying status of the devices.

If the current carrying state of the devices in the first device set is confirmed to be in the same state and the device set is not blocking current in both directions, one or more gate controlled device in a second, inactive set of said gate controlled devices are gated to enable current flow in one direction. If the sensing of voltages indicates the first set is blocking, then devices in the second, inactive device set can be gated to enable current flow in both directions.

The present invention has applications in single phase as well as multiple phase alternating current power systems. From the above it is apparent that one object of the invention is method and apparatus for controlling the switching of a gate controlled switching system to effectively and safely accomplish that switching. These and other objects, advantages and features of the present invention will be better understood by reference to a preferred embodiment of the present invention which is described in conjunction with the accompanying drawings.

BEST MODE FOR PRACTICING THE INVENTION

Figure 1:
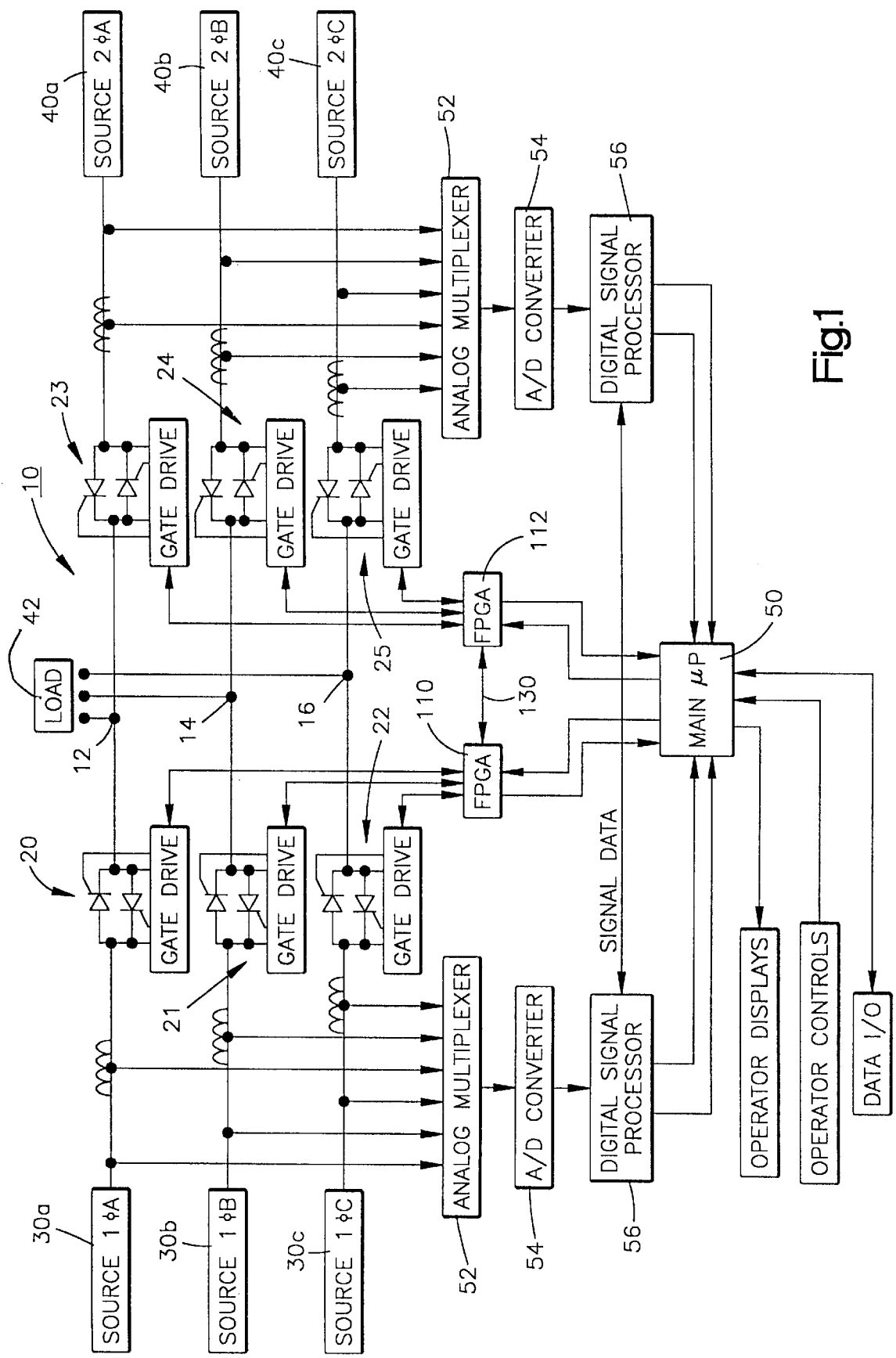
FIG. 1 is a block diagram of a monitoring system that determines the quality of a primary power source for energizing a load and utilizes a static switch to change to a secondary source in the event of a failure or degradation in the primary power source.
Figure 3:
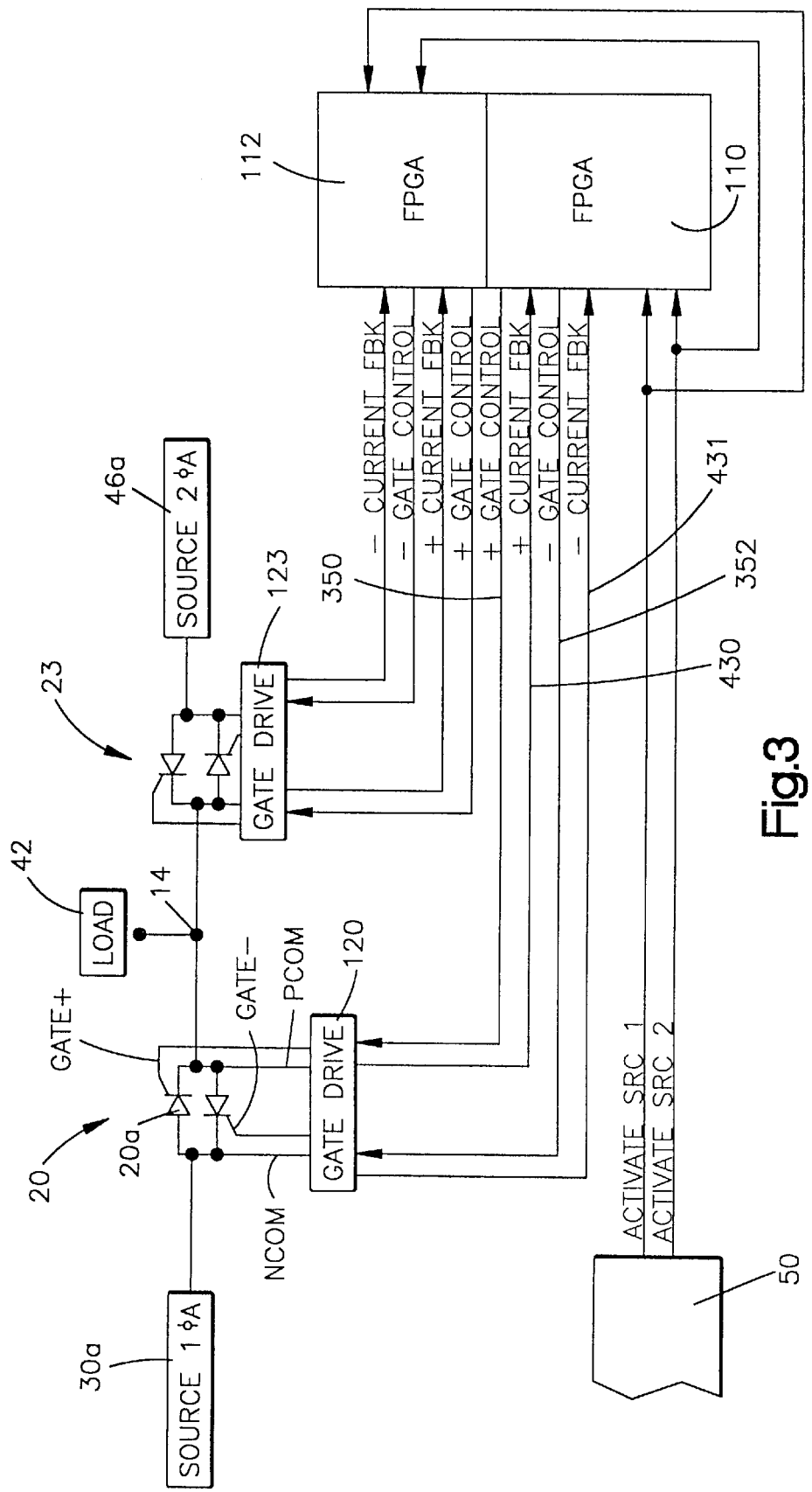

Turning now to the drawings, FIG. 1 is a block diagram of a control system 10 that controls application of power to a load from either of two alternating current power sources. The control system of FIG. 1 illustrates use of the invention with a three phase power delivery system that has the capacity to switch alternate power sources to a load under varying conditions. One possible use of the system 10 depicted in FIG. 1 is in a hospital where it is important that at least some of the electrically powered equipment not lose power and hence a backup power is made available. As seen in the FIG. 3 depiction, the invention also has application in a single phase, single pole alternating current power delivery system.

The control system 10 provides alternate current paths to three junctions 12, 14, 16 through six sets 20–25 of gate controlled current carrying devices coupled to the junctions 12, 14, 16. A primary three phase power source is coupled to three inputs 30a, 30b, 30c in FIG. 1 and a secondary three phase power source is coupled to three additional inputs 40a, 40b, 40c.

FIG. 1 shows a use of the present invention for controlling energization of a load 42 connected to the junctions 12, 14, 16. The load 42 is powered by either the primary or secondary sources and hence is coupled to either the three inputs 30a, 30b, 30c or the three inputs 40a, 40b, 40c.

A controller 50 monitors the condition of the two sets of alternating current signals from the primary and secondary sources by means of signal condition sensors. A presently preferred controller 50 is implemented using a Motorola 68HC16Z1 based microcomputer including I/O interfacing for communicating with the signal condition sensors. As depicted in FIG. 1 the sensors are connected to the controller 50 by means of analog multiplexer circuitry 52, analog to digital converters, 54 and digital signal processors 56. Under certain specified conditions that are monitored by the controller 50 a switch is initiated from one power source such as the primary source connected to the inputs 30a, 30b, 30c to a second power source such as the secondary source connected to the inputs 40a, 40b, 40c.

Figure 2:
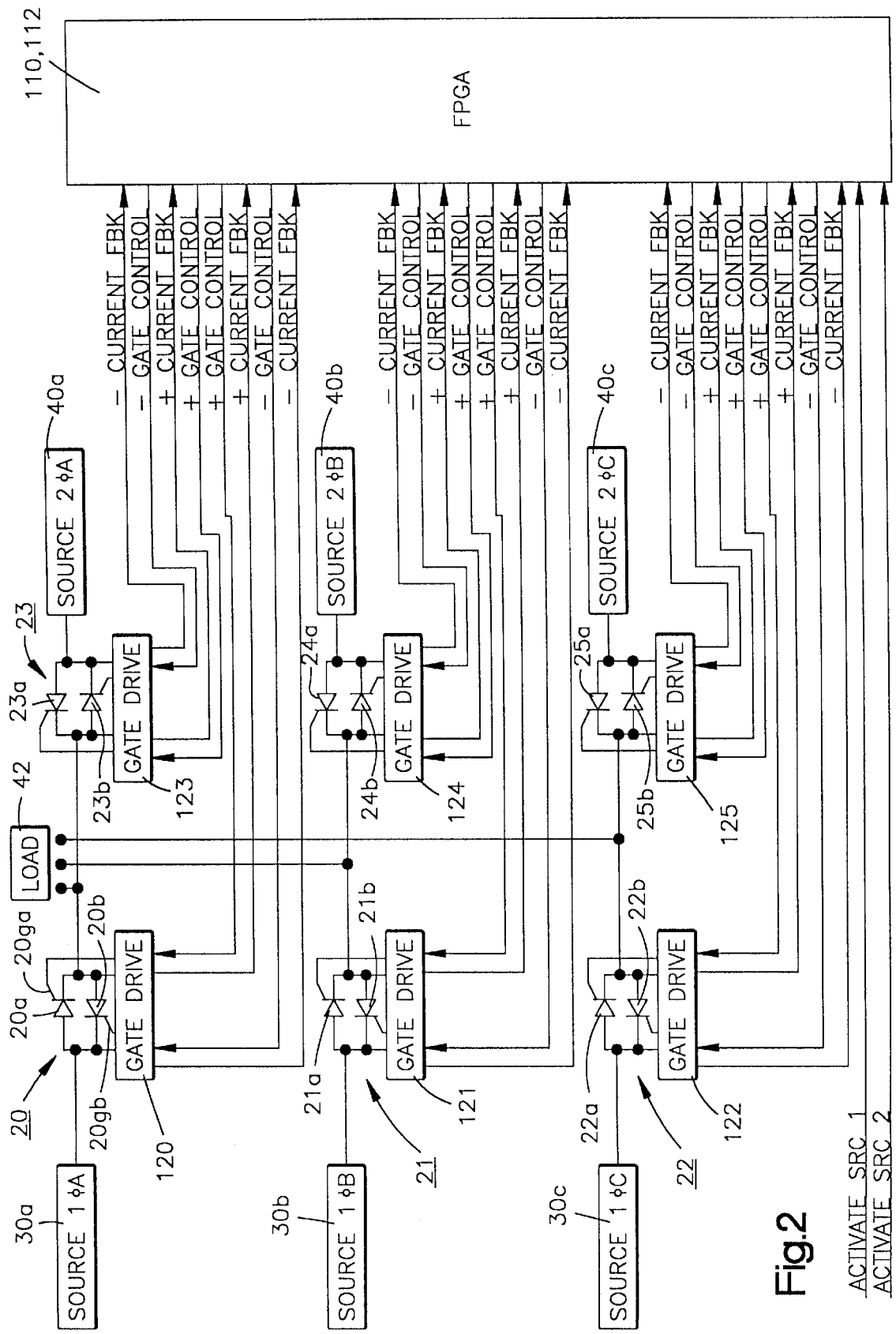
FIGS. 2 and 3 are block diagrams of a three phase and a single phase interface for a static switch constructed in accordance with the present invention.

To switch from one source to another, the controller 50 must de-active an active group of three device sets 20–22, for example, and activate an inactive group of three device sets 23–25. In accordance with a preferred embodiment of the invention a given device set includes oppositely connected gate controlled SCRs. The device set 20 includes two such SCRs 20a, 20b (FIG. 2) that are oppositely connected to carry current in opposite directions during the AC power cycle. Stated another way, during half the AC power cycle one of the two SCRs 20a is forward biased and carries current to the load 42 and during the other half of the AC power cycle the second of the two SCRs 20b is forward biased and carries current to the load 42.

To switch from one power source to another the controller 50 deactivates an active device set by removing gate signals from gate inputs of the two parallel path, opposite sense current carrying SCRs which combine to form an active device set. As an example to deactivate the device set 20 made up of the two SCRs 20a, 20b the gate inputs 20ga, 20gb to these two devices are brought to a system reference or ground voltage.

To perform a safe, yet efficient transfer of power through the junctions 12, 14, 16 from one source to another the controller 50 initiates a transfer and relies upon two field programmable gate array controllers 110, 112 to supervise the shutdown of the active device sets and start up the inactive device sets. The present invention is implemented using model XC3064 field programmable gate array controllers commercially available from Xllinx.

The controllers 110, 112 must sense current through the two devices of each active device set to determine a current carrying state for that set. Six gate drive circuits 120–125 help determine the current state or status of the device sets 20–25 as well as activate and deactivate the SCRs of these device sets. These gate drive circuits 120–125 allow the two controllers 110, 112 to periodically monitor shut down of an active device set and more particularly to periodically monitor current through the two devices of the active set to confirm the current carrying state of the two devices.

As seen by the double pointed arrow in FIG. 1 the two controllers 110, 112 can communicate with each other by means of a transfer bus 130. If the controller 50 determines the primary source is providing unacceptable power, the controller 50 issues a command to the controller 110 to deactivate the device sets 20–22. As the device sets are de-activated the controller 110 communicates with the controller 112 by means of the transfer bus 130 to indicate when it is appropriate to activate the device sets 23–25.

Figure 6:
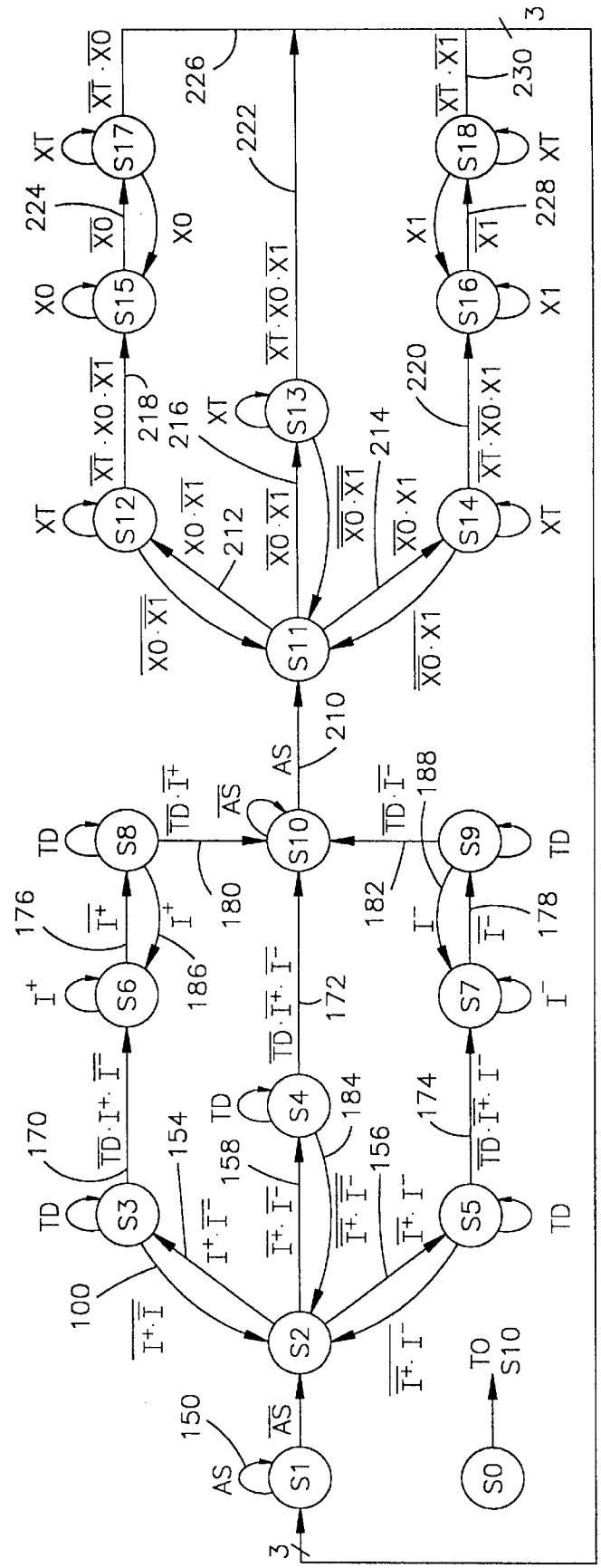
FIG. 6 is a state diagram of a control algorithm that is executed by the signal processor circuit of FIGS. 4 and 5 to apply gating signals to a pair of solid state switches.

The process of switching between an active and inactive device set is more simply described for a single phase, single pole application of the invention. FIG. 3 shows the controllers 110, 112 coupled to the two device sets 20, 23 which couple single phase alternating current inputs through the junction 14 to the load 42. The controllers 110, 112 execute a stored sequence of processing steps that constitute a state machine for controlling the conduction state of the two device sets 20, 23. FIG. 6 illustrates a state diagram for a configuration with two identical state machines running on the controllers 110, 112. It is also within the scope of the invention to implement a single state machine on a single controller for both device sets 20, 23. The steps depicted in the state diagram are readily extendable to a three phase use of the invention. Such implementation could as an example use a separate state machine for each device set 20–25.

STATE DIAGRAM

FIG. 6 depicts a state diagram for a state machine that is implemented by the two controllers 110, 112. Two static or stable states are designated by states S1 and S10 and the remaining states are transition states that the state machine traverses as it switches from one stable state to another. Assume one device set 20 made up of the two SCRs 20a, 20b is in the state S1. In this state the gate inputs 20ga, 20gb to the two SCRs that make up the set 20 are activated and each of the SCRs 20a, 20b conducts during one half cycle of the power cycle. Since the device set 20 is active, the device set 23 made up of the two SCRs 23a, 23b is not active or conducting. A separate state machine identical to the state machine shown in FIG. 6 is running on the controller 112 for the device set 23. This other state machine is in state S10 awaiting a command to become active from the main controller 50.

The manner in which the two device sets 20, 23 leave the states S1 and S10 and switch state, i.e. the device set 20 becomes inactive in state S10 and the device set 23 becomes active and switches to state S1 is described in detail below. To help describe the FIG. 6 state diagram the following labels are appended to transition edges of the state diagram:

1) I+, POSITIVE CURRENT=1
2) I−, NEGATIVE CURRENT=1
3) TD, TIMER RUNNING=1, TIMER FINISHED=0.
4) AS, ACTIVE SOURCE COMMAND BIT, 1 MAKE ACTIVE.

In state S1 of the state transition diagram, the SCR set 20 is active. This means by referring to FIG. 3 that the two SCRs 20a, 20b have signals at their gates to enable conduction and the alternating current signal at the input 30a is coupled through the gate set 20 to the load 42. When in state S1 the two SCRs 20a, 20b remain in this state until commanded to become inactive. Note there are two edges 150, 152 leaving state S1. One edge 150 corresponds to a command to make the device set 20 the active device set (AS=1). Since the device set 20 is already active the edge 150 returns to state S1.

The second edge 152 corresponds to a path for leaving the state S1 and entering the state S2. This edge 152 is traversed when a command is issued to make the active device set 20 inactive (AS=0). By monitoring the signals from the gate control circuit 120 the controller 110 examines the conduction status of the two SCRs 20a, 20b that make up the set 20.

Three possible current conduction sensed status conditions and one error condition are possible when in state S2. If current is flowing in a direction toward the load 42 through the SCR 20a (I+=1), the state machine executed by the controller 110 exits state S2 and moves along an edge 154 to state S3. If current is flowing in a direction away from the load through the SCR 20b (I−=1), the state machine in the controller exits state S2 and moves along an edge 156 to state S5. A third sensed alternative in state S2 is that no current is flowing through the device set 20. This means that the device set is at the zero crossing of the alternating current power cycle when a signal to de-activate the device set 20 is issued by the controller 50. If no current is sensed, the state machine exits state S2 along an edge 158 and enters state S4 in the FIG. 6 state diagram. A final situation is an error condition where both positive and negative currents are sensed. The controller stays in state S2 if this condition is sensed and continues to monitor current.

Exiting the state S2 to either of the three mutually exclusive states S3, S4, S5 causes the controller 110 to start a timer (TR=1) and continue to periodically monitor current. A typical value for the duration of the timer that is started is 300 microseconds.

As the timer runs, if the sensed current status changes from the condition that caused that state to be entered, the state machine returns to state S2. If the sensed current condition in state S3 is anything but a positive current through the SCR 20a, the state machine will return to state S2 by means of the edge transition 160.

If the same current condition is consistently monitored during the sensing of states S3, S4, and S5, a forward transition (to be contrasted with a backward transition to state S2) from these states occurs. State S3 goes to state S6 by an edge 170, state S4 goes to state S10 by an edge 172, and state S5 goes to state S7 by an edge 174. As explained in detail below, a transition from either of the three mutually exclusive states S3, S4, or S5 to other than state S2 causes a transition of the inactive device set 23.

If the state machine running on the controller 110 enters state S6 from state S3 the controller has confirmed that positive current is flowing in the SCR 20a associated with the source being deactivated (I+=1). In a preferred embodiment of the invention this is assured because each and every time the current condition was sensed during the 300 microsecond delay of state S3 a positive current condition is sensed. Preferably sensing occurs about every 10 microseconds. Thus, during state S3 thirty different current condition sensing steps took place and all of them indicated a positive current condition. When the timer times out (TD=0), the state machine exits state S3 along the edge 170. While a preferred implementation requires all sensing steps performed during state S3 to yield the same result, in an electrically noisy environment it is possible that only a certain percentage of current sensings would be required to confirm the status of the device set 20. Also, although multiple current sensing steps are preferred, state S3 could be performed with only a single step to confirm the earlier indication in state S2 that the current is positive.

When the state machine enters the state S6 the controller 112 connected to the device set 23 is signaled by the transfer bus to initiate current flow in a corresponding positive SCR 23a in the device set 23. This is accomplished by application of a gate signal to the SCR gate input 23ga. The state machine for the device set 20 stays in state S6 until the positive current in the SCR 20a stops. When the current is sensed as being zero (I+=0) the state machine enters a state S8 through the transition edge 176.

If the state S7 is entered from state S5, it is known that a negative current (I−=1) is flowing through the SCR 20b. The state machine of the controller 110 signals the other controller 112 and the other controller initiates current flow in a corresponding negative SCR 23b of the device set 23. This is accomplished by application of a gate signal to the SCR gate input 23gb. The state machine for the set 20 stays in state S7 until the negative current in the SCR 20b stops (I−=0). When the current is sensed as being zero the state machine enters a state S9 by the transition edge 178.

The transition from each of the three mutually exclusive states S4, S8, and S9 is typically to the inactive state S10 by means of edge transition paths 172, 180, 182. Upon entering the states S4, S8, or S9 the state machine starts a timer and so long as that timer is running, i.e. TD=1, the state machine continues to monitor current. For state S4, if during any of the multiple current sensing steps the conduction status of the set 20 changes from the no current condition, the state machine returns to state S2 by the edge transition 184. Similarly, if at any time during the multiple current sensing steps in state S8 the conduction state changes to a positive current the state machine returns to state S6 by the transition edge 186. Finally, if at any time during the multiple current sensing steps in state S9 the conduction state changes to a negative current the state machine returns to state S7 by the transition edge 188. Note the two states S6 and S7 have only a single transition edge leaving those states if current has fallen to zero. Thus, even if a backward transition from state S8 to state S6 occurs, the state machine waits for the current to fall to zero and has no other exit transition.

Recall that as one of the state machines for the controller 110 is executing, a similar state machine for the controller 112 is also executing for the device set 23. When the controller 50 instructs the controller 110 to cause the device set 20 to exit state S1 of the controller 110, the controller 50 is simultaneously issuing a command to the state machine running on the controller 112 to exit state S10 and enter state S11 by a one way transition edge 210. When this command comes it is the intent of the controller 50 that the device set 23 become active.

The transitions from the state S11 in FIG. 6 to the states S12–S18 of the state machine are controlled by the sensed status of the device set 20 that is in the process of being deactivated. This information is conveyed to the controller 112 from the controller 110 by means of the transfer bus 130 between these two controllers 110, 112. Data on the bus is sensed by the controller turning off a device set (the controller 112 in this example) and is identified as follows:

POSITIVE CURRENT—X0=1
NEGATIVE CURRENT—X1=1
TIMER RUNNING—XT=1

After the transfer of the state machine running on the controller 112 out of state S10, the state machine is in state S11 and can receive four different messages. If a positive current is sensed in the device set 20 and communicated by the controller 110 to the controller 112, a transition from state S11 to state S12 occurs by the transition edge 212. If negative current is sensed in the device set 20 and communicated by the controller 110 to the controller 112, a transition from state S11 to state S14 occurs by the transition edge 214. If no current is sensed in the set 20 and communicated by the controller 110 to the controller 112, the state machine of the controller 112 causes a transition from state S11 to state S13 by the transition edge 216. The states S12, S13, and S14 track the states S3, S4, and S5 of the state machine in the controller 110.

Assume a positive current is sensed in the device set 20 and has been conveyed on the transfer bus. The state machine running on the controller 112 enters state S12. At the same time state S12 is entered by the controller 112 the controller 110 enters state S3 and starts a timer. So long as the timer of the controller 110 is running (XT=1) and the current sensed by the controller 110 is positive (X0=1) the state machine of the controller 112 remains in the state S12. Once the timer elapses (XT=0) the state machine shifts to state S15 by an edge transition 218. In state S15 the controller 112 causes the positive SCR 23a to be gated into conduction.

Now assume a negative current is sensed by the controller 110 in state S2. The state machine running on the controller 112 is sent information that causes a switch to state S14 by the edge transition 214. At the same time state S14 is entered by the controller 112 the controller 110 enters state S5 and starts a timer. So long as the timer of the controller 110 is running (XT=1) and the current sensed by the controller 110 is negative (X1=1) the state machine of the controller 112 remains in the state S14. Once the timer elapses (XT=0) the state machine shifts to state S16 by an edge transition 220. In state S16 the controller 112 causes the negative SCR 23b to be gated into conduction.

If no current is sensed by the controller 110 in state S2 (X0=X1=0), the state machine running on the controller 112 switches to state S13 by the edge transition 216. At the same time state S13 is entered by the controller 112 the controller 110 enters state S4 and starts a timer. So long as the timer of the controller 110 is running (XT=1) and the current sensed by the controller 110 is zero (X0=X1=0) the state machine of the controller 112 remains in the state S13. Once the timer elapses (XT=0) the state machine shifts by the transition 222 to state S1 and in this state the controller 112 causes the gates of both the positive and negative SCRs 23a, 23b to be gated allowing conduction in both directions between the load 42 and the input 40a.

Returning to state S15, one notes that in this state the positive SCR 23a is gated into conduction but the negative SCR 23b has not yet been gated into conduction. When the controller 112 gates the SCR 23a, the controller 110 is in state S6 and continues to monitor current until the current in the SCR 20a goes to zero. When the current reaches zero, the controller 110 moves to state S8 and also sets X0=0 on the transfer bus. This causes the controller 112 to shift to state S17 by means of the edge transition 224. After the time delay imposed during state S8 and assuming the current in the SCR 20a remains zero for that time delay the controller 110 shifts to state S10 and also sets XT=0. This causes the controller 112 to shift to state S1 by the edge transition 226 and gate the negative SCR 23b into conduction.

If the controller 112 is in state S16, the negative SCR 23b has been gated into conduction but the positive SCR 23b is not yet conducting. When the controller 112 gates the SCR 23b, the controller 110 is in state S7 and continues to monitor current until the current in the SCR 20b goes to zero. When the current through the SCR 20b does reach zero, the controller 110 moves to state S9 and also sets X1=0 on the transfer bus. This causes the controller 112 to shift to state S18 by means of the edge transition 228. After the time delay imposed in state S9 and assuming the current in the SCR 20b remains zero for that time delay the controller 110 shifts to state S10 and also sets XT=0. This causes the controller 112 to shift to state S1 by the edge transition 230 and gate the positive SCR 23a is gated into conduction.

GATE CIRCUITS

Figure 4A:
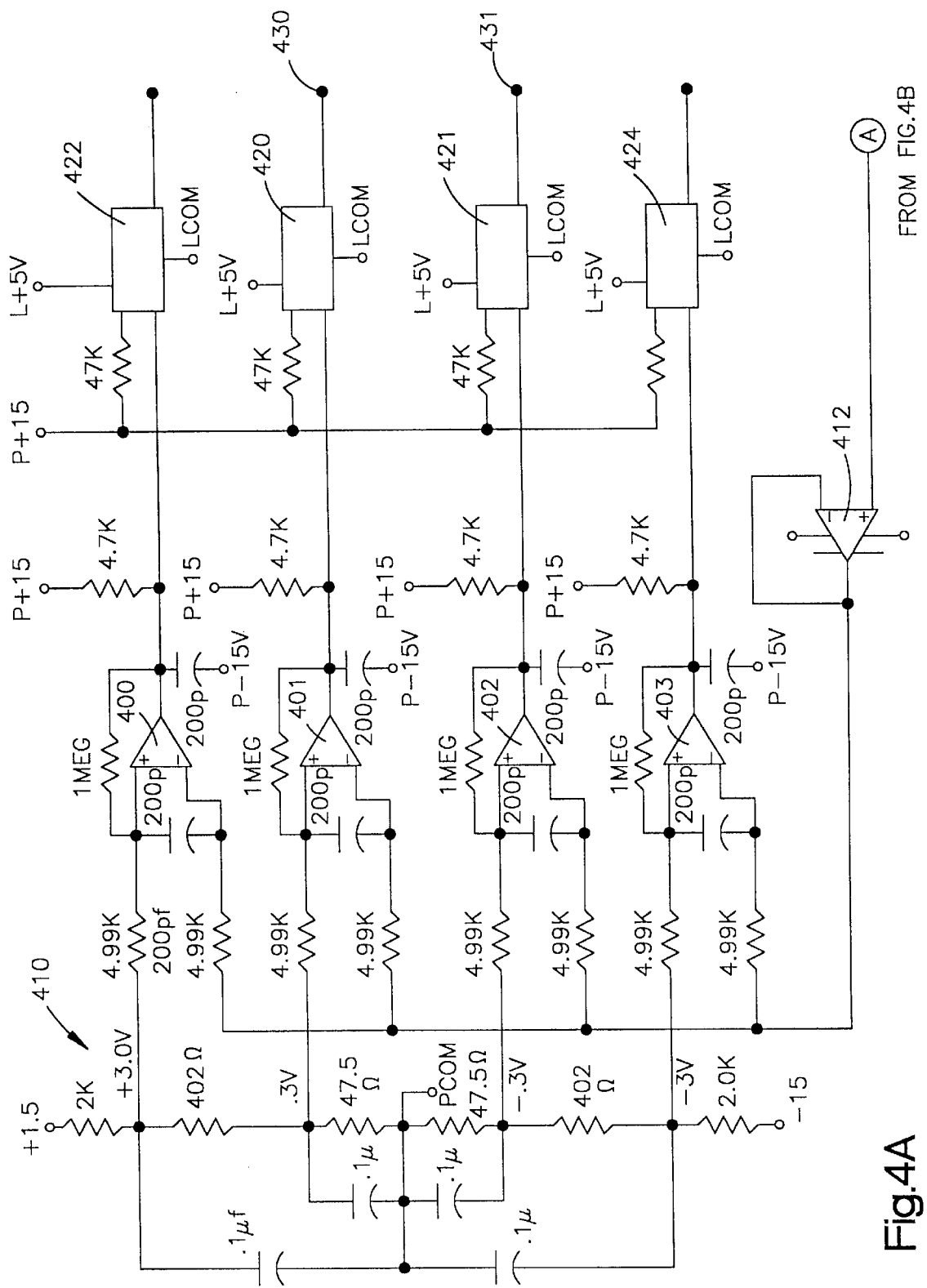
FIGS. 4A, 4B, and 5 are detailed schematics of gate control circuitry for connecting a pair of solid state switches to a signal processor circuit that activates gate inputs to the solid state switches.
Figure 4B:
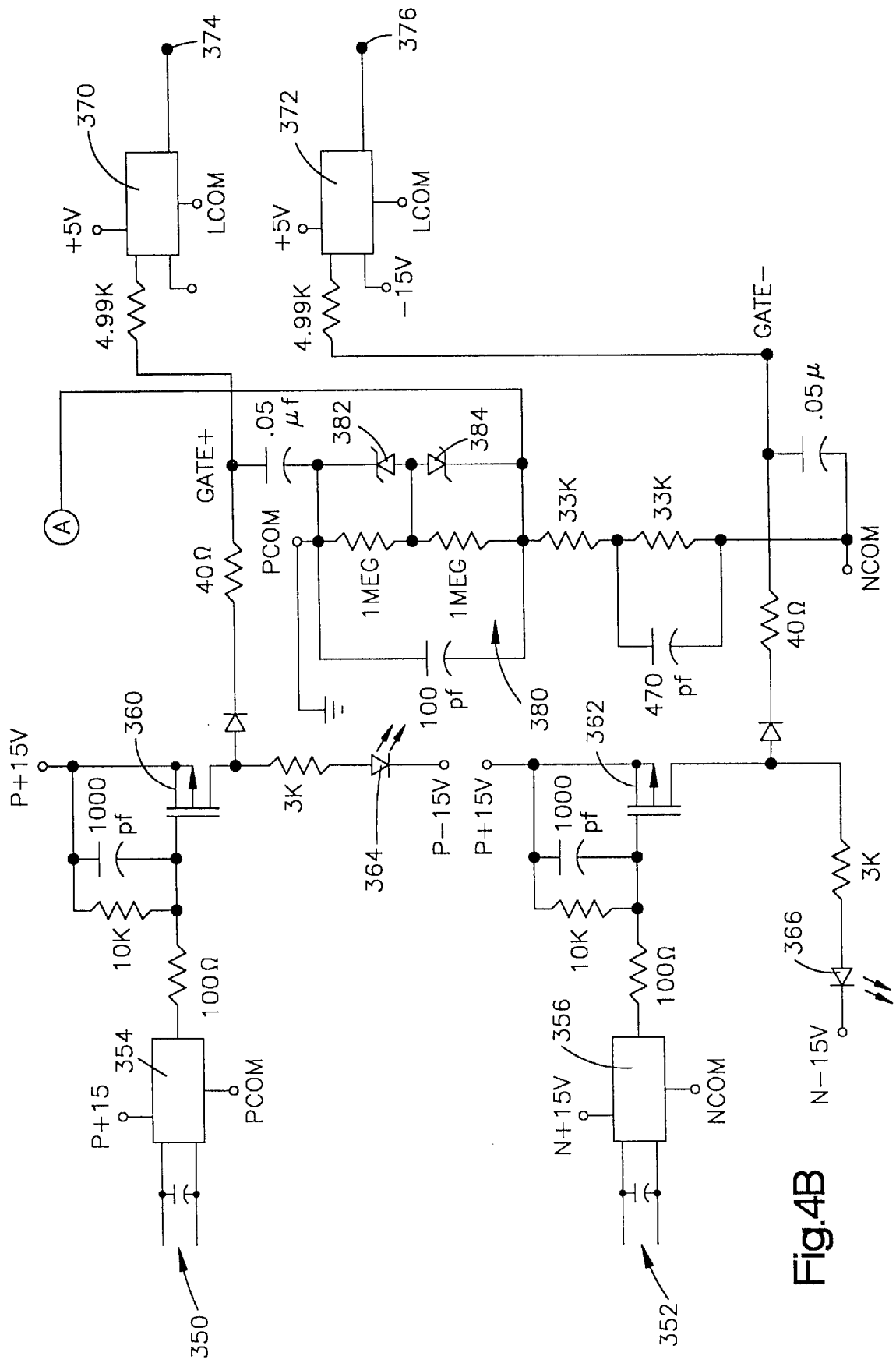
Figure 5:
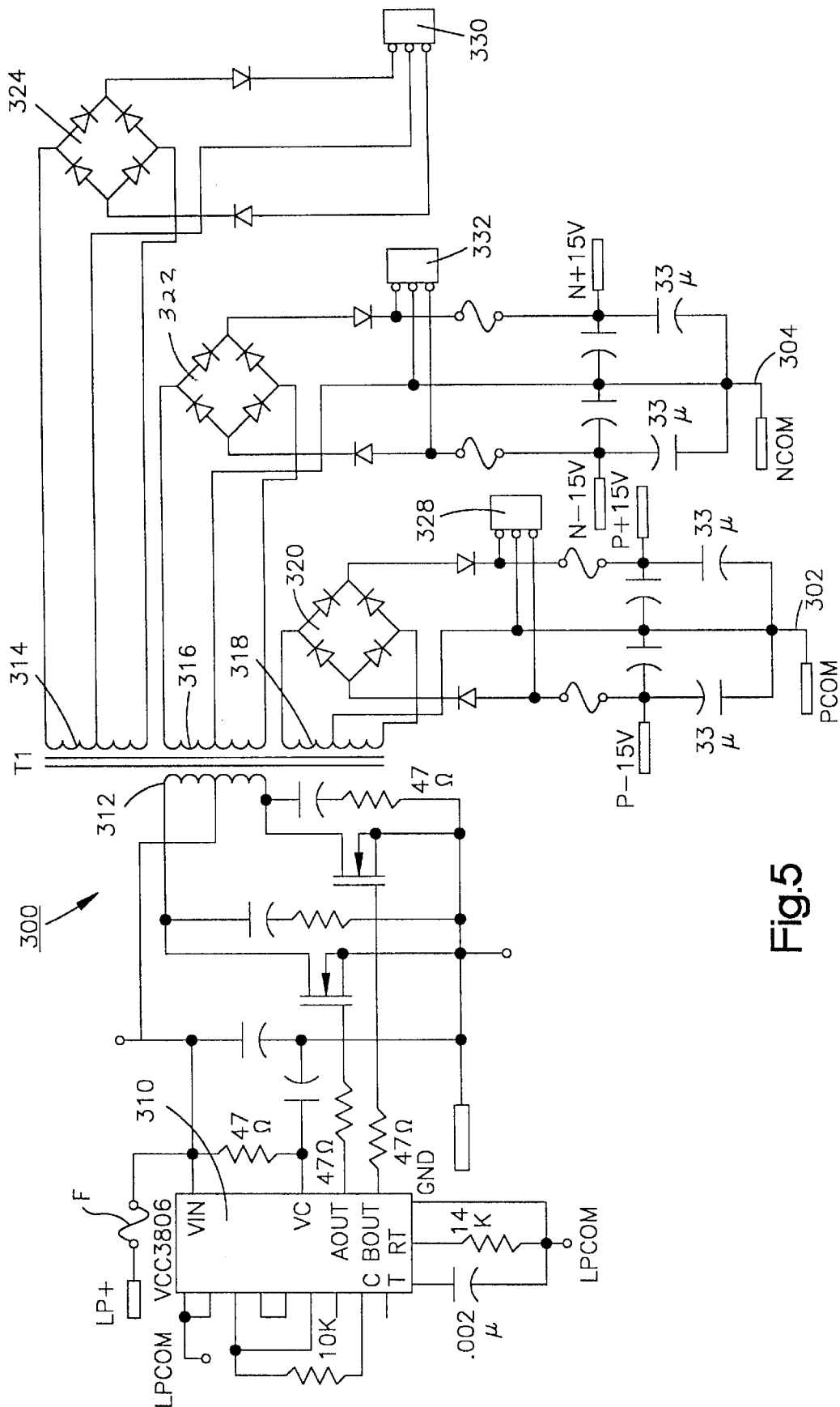

FIG. 5 depicts a power supply 300 for applying positive and negative 15 volt d.c. signals to the gate drive circuits 120–125. In the switching system 10 shown in FIG. 1 and 2 the power supply 300 would supply these signals to the gate drive circuits 120–122 and a similar power supply would supply signals to the gate drive circuits 123–125. Two signals labeled PCOM 302 (circuit ground) and NCOM 304 in the drawing are midway between the positive and negative 15 volt signals and are connected to a representative gate drive circuit 120 illustrated in FIGS. 4A and 4B. An integrated circuit 310 on the left hand side of the power supply schematic is a switching power supply circuit for applying an alternating current output to the primary winding 312 of a transformer T1. Inputs to the circuit 310 labeled LP+ and LPCom are 15 volt D.C. inputs to the power supply 300. The transformer output is tapped by three secondaries 314, 316, 318 which are applied to three full wave rectifiers 320, 322, 324. An output from two of the full wave rectifiers 320, 322 produces the plus and minus 15 volt direct current signals and the NCOM and PCOM signals for the circuit 120.

An output from a third full wave rectifier 324 provides a backup direct current input to the gate drive circuit 123. A PCOM connection 328 from the gate drive 120 is coupled to a corresponding PCOM connection (not shown) of the gate drive 123. A connector 330 coupled to the full wave rectifier 324 routes three signals to a NCOM connector of the circuit 123 such as the NCOM connector 332. An extra output from the circuit 123 connects to the connector 332 of the circuit 300 depicted in FIG. 5. If the switching power supply of one gate drive (120 or 123) fails, the backup from the functioning circuit allows both circuits 120, 123 to operate and perform its gate monitoring functions.

FIGS. 4A and 4B illustrate the gate drive circuit 120 for one set 20 of oppositely connected SCRs 20a, 20b. Four connections between the gate drive circuit 120 and the device set 20 are a) the NCOM connection 304, b) a minus gate connection 20gb, c) the PCOM connection 306, and d) the plus gate connection 20ga to the SCR 20a. Turning to FIG. 4B, there are two inputs 350, 352 on the left of the circuit corresponding to gate control inputs from the controller 110 for activating the gate input to a given SCR. The top input 350 activates the positive gate input 20ga of the SCR set 20, and the bottom input 352 activates the negative gate input.

The inputs 350, 352 pass through optoisolator circuits 354, 356 to MOSFET switching transistors 360, 362 which activate the respective gate inputs designated GATE+ and GATE– shown in FIG. 3. The transistors 360, 362 are also coupled to diagnostic light emitting diodes 364, 366 for indicating a given SCR has been activated. The output from the two MOSFETS are coupled to the gates of the SCRs 20a, 20b and to optoisolators 370, 372 in the upper right hand portion of FIG. 4B used to provide diagnostic outputs 374, 376. Use of the opto-isolators 354, 356, 370, 372 shields the low voltage d.c. controllers 110, 112 from the high voltage a.c. signals at the inputs 30a, 40a.

FIG. 4B also indicates PCOM and NCOM connections from the power supply 300 that are connected across a voltage divider network 380 having an output labeled "A" in FIG. 4B. This output allows the circuitry shown in FIG. 4A to determine the current carrying status of the parallel coupled SCR set 20. The PCOM connection is considered to be a ground connection for this circuit. As the AC signal across the SCR set oscillates back and forth, the output A changes back and forth, above and below PCOM depending upon the current carrying status of the SCRs. Two zener diodes 382, 384 insure the voltage at the junction A is clamped to within 5 volts of PCOM. The output signal at the junction A is coupled to a set of four comparators 400–403 in FIG. 4A to produce an appropriate output depending upon the current carrying state of the two SCRs coupled to the gate drive circuit 300.

The assumption is made that ff the voltage drops below 300 millivolts across the SCR, its current is less than the minimum holding current required to maintain the SCR in the conducting state. A forward biased SCR will have more than 300 millivolts across its forward biased connections. A voltage divider 410 at the left hand portion of FIG. 4A defines reference voltages of +3 volts, +0.3 volts, −0.3 volts, and −3 volts. A unity gain buffer amplifier 412 coupled to the input A of FIG. 4A transmits the voltage from the voltage divider 380 of FIG. 4B to inverting inputs to the four comparator amplifiers 400–403 in the middle of the figure. A topmost comparator amplifier has a +3 volt input at the non-inverting input and has a high output whenever the voltage at the junction A is less than 3 volts. A voltage of greater than 3 volts for a sustained period of time on the order of a few milliseconds indicates an extreme condition has been experienced, and power should be switched to another source.

This overvoltage protection is separate from the signal quality sensing conducted by the controller 50. As seen below a voltage of greater than 3 volts for a short period of time is not necessarily a problem but is treated in a slightly different manner from the technique disclosed in applicant's prior application Ser. No. 08/412,067.

Assuming the voltage is less than 3 volts but greater than 0.3 volts, the comparator amplifier 401 switches states and produces a low output causing an optoisolator circuit 420 on the right hand side of the 4A circuit to also provide a low signal at an output 430. The other optoisolator circuits similarly go low in response to certain sensed conditions. Both a top and a bottom optoisolator circuit 422, 424 typically will not provide low outputs during normal operation of the circuit 120. During the 60 Hz signal applied across the SCRs, the two middle optoisolator circuits 420, 421 alternate, first one and then the other, at a 60 cycle per second rate from low to high signals at the outputs 430, 431. For a brief interval at the zero crossing point both outputs 430, 431 are low and this would account for the need in the state machine of FIG. 6 to accommodate a sensing of zero current through a device set.

The state machine described above in relation to FIG. 6 controls the gating of the SCRs in response to control inputs and the conduction status of the SCRs. Various methods of implementation are limited only by available technology. For example, the state machine could also be implemented by a) a software program running on a computer, such as a microprocessor, microcomputer or embedded microcontroller, b) a synthesis of discrete logic gates and flip flops, c) a configuration of another programmable logic device, such as an EPLD or PAL, c) a mask programmed gate array or other custom ASIC, or d) a general purpose industrial logic programmable logic controller.

Figure 7:
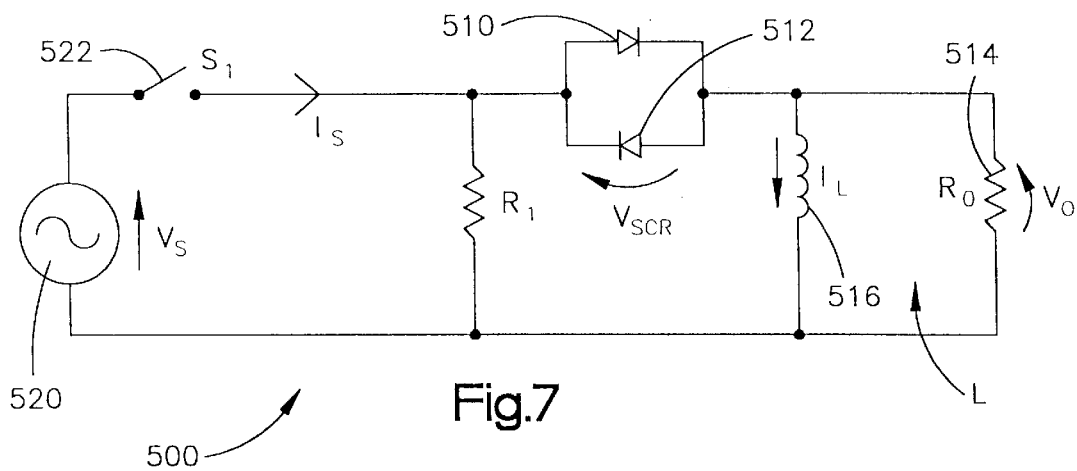
FIG. 7 is a schematic diagram showing an equivalent circuit for illustrating aspects of the present invention.

FIG. 7 depicts a circuit 500 that represents an equivalent circuit containing a load L and a pair of oppositely connected SCRs 510, 512. The load L includes a resistive component 514 and an inductive component 516 connected in parallel and the load is energized through the combinations of SCRs 510, 512 by a source 520 which is disclosed as an alternating current source that activates the load through the SCRs and a switch 522 connected to the load.

In the event the source 520 is deemed unsuitable and it is desirable to couple a different source to the load L, the switch 522 is opened and a second, substitute source is coupled to the load L through a second set of parallel coupled SCRs. As outlined above, the opening of a switch such as the switch S1 does not actually take place. Instead, the SCRs 510, 512 are rendered non-conductive when their gate signal is removed and the circuitry external to the SCRs causes their current to fall below the holding current. Under such circumstances a premature coupling of the second source to the load could couple together the sources with potentially serious problems.

Figure 8:
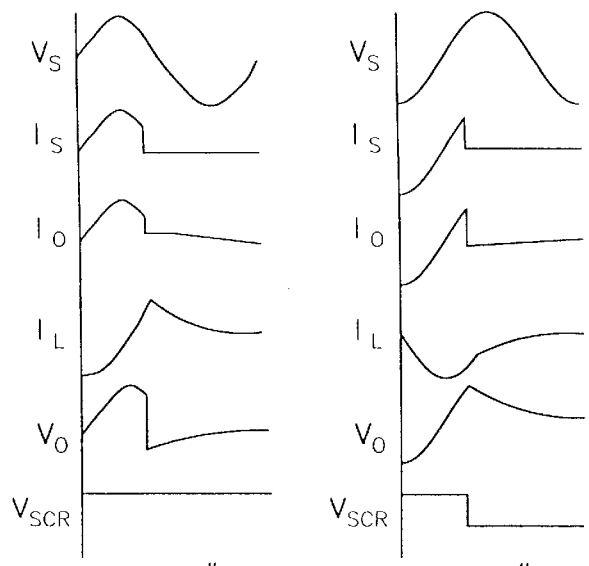
FIG. 8 are waveforms showing various sensed parameters of the FIG. 7 schematic diagram as switching occurs.

Two different situations are depicted in FIG. 8 and are labeled Case #1 and Case #2. These situations indicate the status of labeled parameters in the FIG. 7 circuit just after the switch 522 is opened to disconnect the source 520 from the two parallel coupled SCRs 510, 512. In Case #1 the switch opens at a time when the values $V_s$ and $I_L$ are of the same polarity. Case #2 is a situation where the switch opens at a time when the values of $V_s$ and $I_L$ are of an opposite polarity.

In Case #1, when the switch 522 opens, the current through the resistor and the inductor will circulate such that the voltage VSCR across the SCRs will maintain its polarity when the polarity of the voltage $V_{SCR}$ across the resistor 514 reverses. This results in efficient switching to the second source without undue disruption of power applied to the load.

In Case #2 when the switch 522 opens, the voltage $V_s$ and current $I_L$ are of opposite polarity and the current $I_L$ circulates so that the voltage across the SCRs VSCR reverses polarity while the polarity $V_O$ across the resistor 514 remains the same. The polarity reversal of $V_{SCR}$ is responsible for the FIG. 6 technique discussed above in gating the new SCR pair to which current is being transferred to in a less efficient fashion that is remedied by practice of the present invention.

Figure 9A:
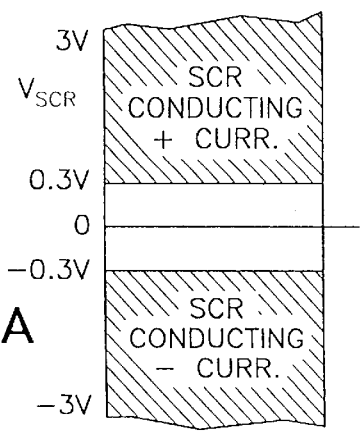
FIGS. 9A and 9B are illustrations of threshold voltage waveforms that indicate the sensed conditions used in switching techniques practiced in accordance with the present invention.

It is instructive to examine operation of the FIG. 6 switching algorithm when a voltage threshold such as the threshold of FIG. 9A is utilized. In FIG. 9A a sensed voltage of between 0.3 V and −0.3 V causes the branch from state S2 to S4 to be taken by the process depicted in FIG. 6. Any voltage greater than 0.3 Volts, including short duration voltages of greater than three volts causes a branch from state S2 to state S3. Any voltage less than −0.3 volts for a short duration causes the branch from state S2 to state S5.

Assume a voltage of 4 volts is sensed. If this condition is sensed repeatedly (longer than a few milliseconds), it is an error condition. The FIG. 6 procedure would assume, however, that the voltage across the SCR set would drop below 3 volts but that one of the SCRs would remain forward biased. As seen in the Case #2 example, however, this is not necessarily so. It is more likely that a short duration voltage of 4 volts indicates the SCR set is blocking current in both directions and the appropriate branch in the FIG. 6 technique would be to state S4 rather than a branch to state S3. The advantage in branching to state S4 immediately is that instead of branching to state S3 and then backtracking through state S2 when the short duration voltage of 4 volts disappears the process more correctly judges short duration voltages of greater than 3 volts or less than −3 volts as an indication that both SCRs are blocking current rather than the situation that one is carrying current.

Figure 9B:
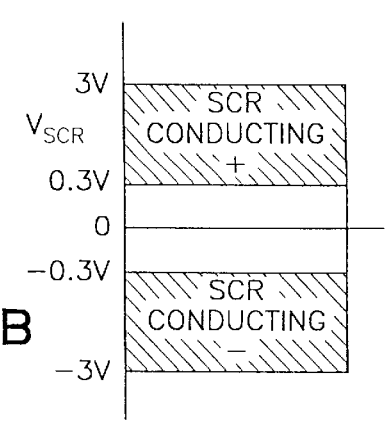

In accordance with the presently preferred implementation of the invention a threshold or range of voltages is chosen to define transition states that is depicted in FIG. 9B. In this figure voltages in the range 0.3 to −0.3 and greater than 3 volts (both positive and negative) are treated the same, i.e. indicative of a blocking or otherwise non-conductive condition so that the transition to state S4 is chosen. Voltages across a set of SCRs between 0.3 and 3 volts cause the transition from state S2 to S3 and voltages between −0.3 and −3 volts cause the transition from state S2 to S5. Extended (several milliseconds) voltage excursions of more than 3 volts are still error conditions which cause traversal of the switching algorithm to abort.

Although a preferred embodiment of the invention has been described with a degree of particularity, it is the intent that the invention include all modifications and alterations from the disclosed design falling within the spirit or scope of the appended claims.

What is claimed:

1. A method for providing alternate current paths to a junction through gate controlled current carrying devices wherein each of said current carrying devices within a set of such devices blocks current flow in one direction and selectively allows current flow in an opposite direction when a gate to said devices is activated, said method comprising the steps of:

a) initiating a switch away from a first current path through a first, active device set of two or more current carrying devices to a second current path through a second, inactive device set of two or more current carrying devices by removing a current sustaining gate signal from the current carrying devices of the first device set;

b) sensing a current status of the devices of the first, active device set to determine a,current carrying status of said devices by monitoring a voltage across the first device set;

c) if the voltage falls within a specified range designating at least one of the devices that make up the active device set as being current carrying and otherwise designating the active device set as being blocking current in both directions;

d) again sensing a voltage across the devices of the first device set to confirm the current carrying status of said devices; and e) if the current carrying state of said devices in the first device set is confirmed in step d to be in the same state sensed in step c, and the device set is not blocking current in both directions, gating one gate controlled device in a second, inactive set of said gate controlled devices to enable current flow in one direction through said one gate controlled device of the second, inactive device set.

2. The method of claim 1 wherein the sensing step of step b causes the devices of the first set to be designated as blocking if the voltage across said first set has an absolute value of less than a first voltage or greater than a second voltage.

3. The method of claim 2 wherein the current carrying devices are silicon controlled rectifiers and the first voltage is 0.3 volts and the second voltage is 3 volts.

4. The method of claim 2 wherein if the voltage is less than the first voltage or greater than the second voltage all of the current carrying devices of the inactive device set are gated into conduction in step e.

5. The method of claim 1 wherein if in step b a voltage of greater than a specified value is sensed for longer than a specified duration an error condition is designated.

6. Apparatus for coupling a source to a load through a junction comprising:

a) a first set of gate controlled switches coupled to a junction wherein one switch of the first set conducts current in one sense and another switch of the first set conducts current in an opposite sense;

b) a second set of gate controlled switches coupled to said junction wherein one switch of the second set conducts current in one sense and another switch of the second set conducts current in an opposite sense;

c) a monitoring circuit for monitoring a current status of the switches of the first and second sets of gate controlled switches; said monitoring circuit comprising threshold determining circuits coupled to the switches of a respective device set for categorizing a current status of the devices that make up a device set as having either i) a positive current carrying state; ii) a negative current carrying state; or iii) a blocking state;

d) a first and a second gate control circuit for gating the switches of the first and second sets of switches into conduction; and e) a controller coupled to the first and second gate control circuits for activating switches in the first and second sets by actuating the first and second gate control circuits as said controller determines which set of said first and second set of switches to render active; said controller also coupled to said monitoring circuits to monitor the current carrying state of the first and seconds sets of switches; said controller comprising a stored program for instructing the gate control circuits to remove a gating signal from the gate electrodes of a first active switch set and subsequent to the removal of the gating signal for repeatedly monitoring an output from the monitoring circuits to confirm a status of the current in the switches of a first switch set and subsequent to such confirmation for then applying a gate signal to the gate electrodes of switches in a second inactive switch set and thereby allow current to flow through the second switch set.

7. The apparatus of claim 6 wherein the threshold determining circuit indicates a positive current carrying state if a voltage across a gate controlled switch set falls in one range, the circuit indicates a negative current carrying state if the voltage across a gate controlled switch set falls in a second range and otherwise indicates a blocking condition.

8. The apparatus of claim 7 wherein the first and second ranges are plus and minus voltages of approximately the same size.

9. The apparatus of claim 6 where the switches are silicon controlled rectifiers and the first and second ranges are from approximately 13 volts to 3 volts.

10. The apparatus of claim 7 where the controller includes timing means for sensing voltages above the first and second ranges for an extended period and designating such condition as an error condition independent of switch of the switch sets.

* * * * *